(12) United States Patent
Banville et al.

(10) Patent No.: US 7,009,123 B2
(45) Date of Patent: Mar. 7, 2006

(54) BREAKING DETECTOR FOR SHEAR PIN

(75) Inventors: Jean-Pierre Banville, Baie-Comeau (CA); Gilles Côté, Baie-Comeau (CA); Jean-Claude Ouellet, Baie-Comeau (CA); Rémi Tremblay, Laprairie (CA)

(73) Assignee: Hydro-Québec, Montréal (CA)

( * ) Notice: Subject to any disclaimer, the term of this patent is extended or adjusted under 35 U.S.C. 154(b) by 78 days.

(21) Appl. No.: 10/765,273

(22) Filed: Jan. 28, 2004

(65) Prior Publication Data

US 2004/0252029 A1    Dec. 16, 2004

(30) Foreign Application Priority Data

Jan. 28, 2003   (CA) .................................. 2418245

(51) Int. Cl.
    *H01H 9/00*    (2006.01)
(52) U.S. Cl. .................. 200/61.08; 200/300; 200/310
(58) Field of Classification Search ............ 200/61.08, 200/61.13, 61.14, 61.18, 300, 310–317
    See application file for complete search history.

(56) References Cited

U.S. PATENT DOCUMENTS 3,230,327 A * 1/1966 McDowell ............... 200/61.08
3,477,019 A * 11/1969 Hartmann ................... 324/519
3,936,621 A * 2/1976 Palin et al. ............... 200/61.08
4,006,326 A * 2/1977 Lejeune .................... 200/61.24
4,246,456 A * 1/1981 Leonard ................... 200/61.08
4,327,359 A * 4/1982 Kurtz .......................... 340/566
4,829,390 A * 5/1989 Simon ......................... 361/49

FOREIGN PATENT DOCUMENTS

JP              4-204394        *  4/1992

* cited by examiner

*Primary Examiner*—Michael A. Friedhofer
(74) *Attorney, Agent, or Firm*—Foley & Lardner LLP

(57) ABSTRACT

A breaking detector for a shear pin having a central bore, comprises an electrically conductive element forming an elongated loop extending on a length of the bore of the shear pin and having upper ends defining contact surfaces adjacent to each other. An electrically insulating element extends in the loop, to prevent the conductive element from short-circuiting. Power supply cables are connected respectively to the contact surfaces and are provided with connectors facilitating connection of the breaking detector to other breaking detectors or to an alarm panel. An electrically insulating body removably supports the elements of the detector in the bore of the shear pin. An identification circuit having a light indicator connected between the contact surfaces and projecting at an upper end of the body allows to locate a defective shear pin having broken the conductive element.

18 Claims, 4 Drawing Sheets

BREAKING DETECTOR FOR SHEAR PIN

FIELD OF THE INVENTION

The invention relates in general to a breaking detector for a shear pin.

BACKGROUND

In a wicket gate system of a hydroelectric turbine, the gates are oriented by means of a mechanism having articulated arms. The articulations of the arms are maintained by shear pins adapted to break when an abnormal effort is applied on a gate. Such a situation may happen if, for example, a gate jams a wood log or a rock during the closure. By breaking, the shear pin protects the gate and all the gating mechanism which is linked to it against more important breakage. Each shear pin acts so to speak as a mechanical fuse which protects the gating mechanism. It is necessary to detect as soon as possible the breaking of a shear pin and to identify the defective shear pin to re-establish the proper functioning of the gating system. For this purpose, it has been taught to insert a tearing or breaking detector in each shear pin.

The current detectors are normally made of a wire inserted in a bore at the center of a shear pin. The bore is filled with epoxy to hold the wire in place. Each detector is connected in series with the others up to a common alarm point usually supplied with less than 100 Vac.

When a shear pin breaks, the wire is cut and the loss of power supply triggers an alarm. The detectors being connected in series, it is not possible to readily determine which shear pin is defective.

By their situation, the wires connecting each detectors are sometimes snagged and disconnected. In order to limit the reparations, each detector is preferably provided with quick connectors. If a cable breaks, only the broken part is changed. Mechanical protection systems are also added on each shear pin to protect the quick connectors against breakage by snag. Despite everything, certain mechanical breakages requiring replacement of the cables occur. Furthermore, the shear pins often bathes in water, oil and grease. In the long run, these conditions finally attack the cables and the connectors.

There is often groundings and the detection is difficult since the system is connected in series, in floating point. Since the wires are embedded in epoxy, it is then necessary to remove the shear pin completely, to clean it from the epoxy and re-install a new detector. Faced with the extent of work to be done, it becomes more simple to change the shear pin by a new one, which involves higher costs. In the case where the connections between the detectors run from the bottom of a shear pin to the top of another, it may be difficult to remove the portion of a broken cable hanging under a shear pin.

SUMMARY

An object of the present invention is to provide a breaking detector for a shear pin which facilitates the detection of a defective shear pin.

Another object of the present invention is to provide such a breaking detector which is easily replaced without necessarily having to change the shear pin if it is still in good condition.

Another object of the present invention is to provide such a detector which is more resistant to water, oil and grease than the current detectors.

Another object of the present invention is to provide such a detector which is easily adaptable to any kind of installation.

According to one aspect of the present invention, there is provided a breaking detector for a shear pin having a central bore, comprising:

an electrically conductive element forming an elongated loop extending on a length of the bore of the shear pin and having upper ends defining contact surfaces adjacent to each other;

an electrically insulating element extending in the loop;

supply cables connected respectively to the contact surfaces and provided with connectors; and an electrically insulating means for removably supporting the elements of the detector in the bore of the shear pin.

Preferably, the detector will comprise an identification circuit having a light indicator connected between the contact surfaces, the light indicator projecting at an upper end of the means for supporting.

BRIEF DESCRIPTION OF THE DRAWINGS

A detailed description of preferred embodiments of the invention will be given hereinbelow with reference to the following drawings, in which like numbers refer to like elements.

DETAILED DESCRIPTION OF THE PREFERRED EMBODIMENTS

Figure 1:
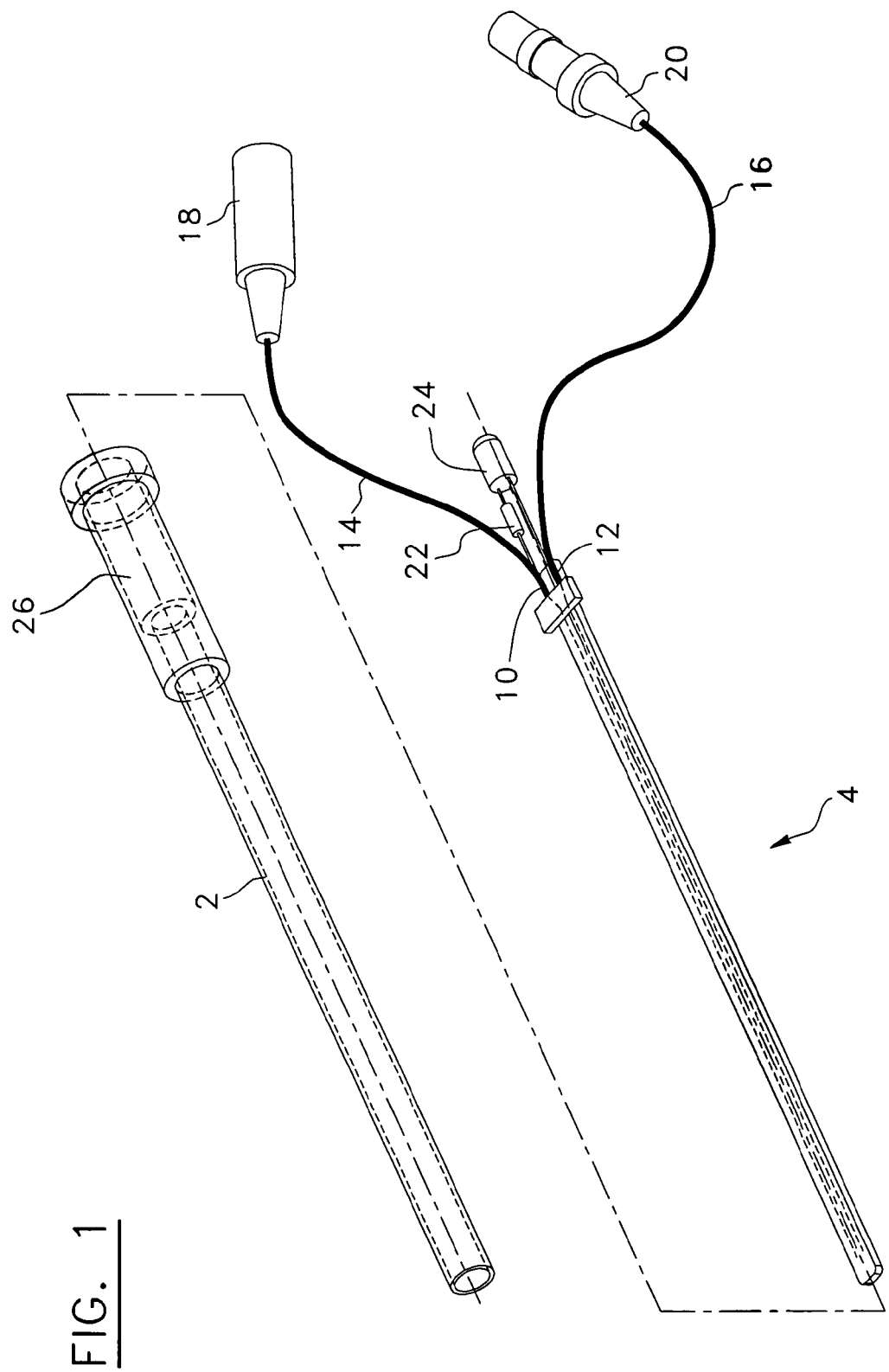
FIG. 1 is a schematic perspective view of a breaking detector.

Referring to FIG. 1, the shear pin breaking detector comprises a tube 2 in which a printed circuit 4 is inserted. The tube can be made in Plexiglas (Trademark), in Bakelite (Trademark) or any other plastic or other material capable of supporting the working conditions of the detector.

Figure 3:
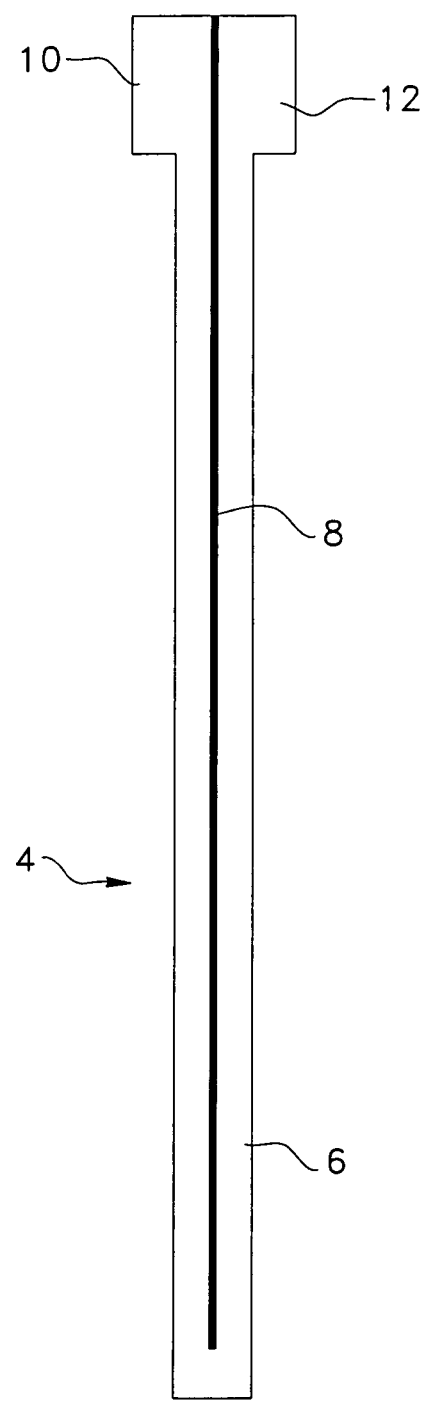
FIG. 3 is a schematic elevation view of printed circuit of a breaking detector.

Referring to FIG. 3, the printed circuit 4 comprises a conductive strip 6 e.g. made of copper on each side of a central insulating strip 8. The conductive strip 6 has upper ends forming connection terminals 10, 12 on each side of the insulating strip 8.

Figure 4:
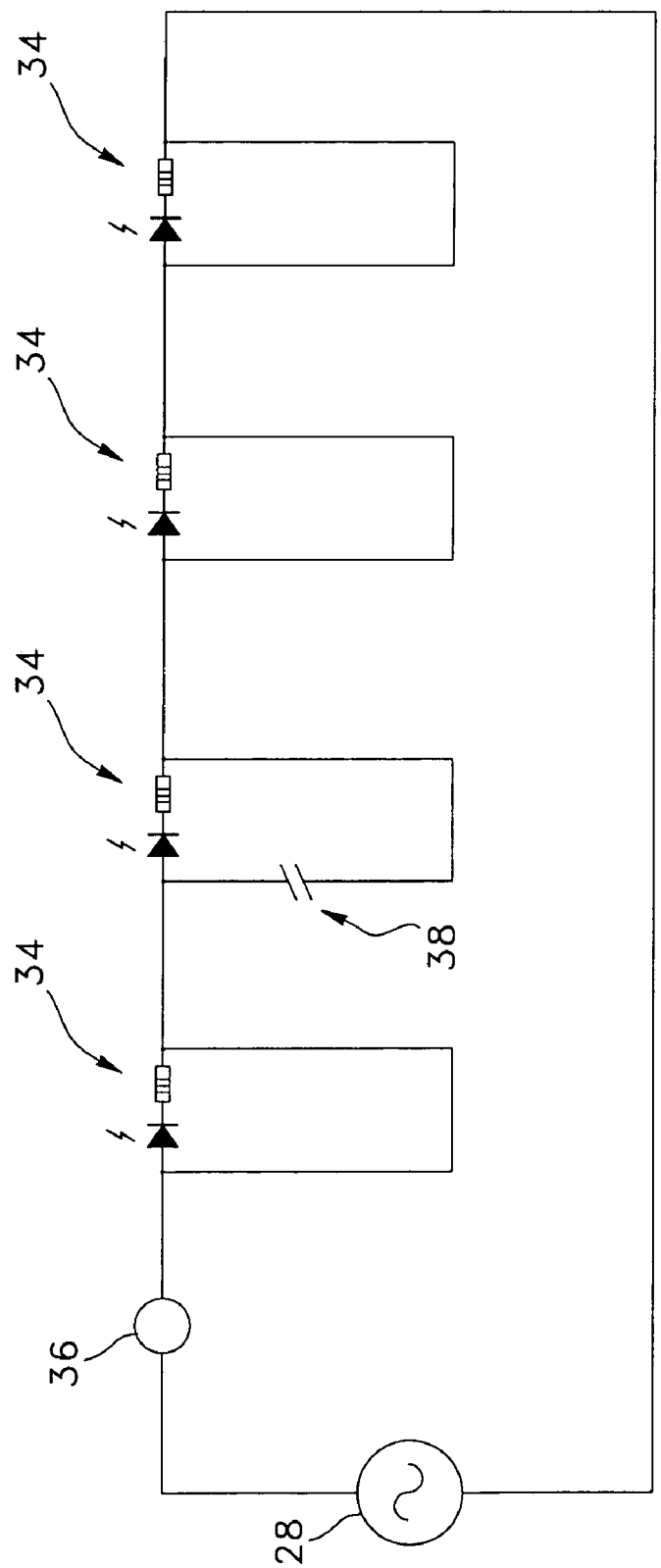
FIG. 4 is a schematic diagram of a circuit made of several breaking detectors.

Referring again to FIG. 1, the connection terminals 10, 12 are connected to respective cables 14, 16 provided with female and male connectors 18, 20 allowing series connection of the breaking detector with other similar detectors up to a power supply source 28 as illustrated in FIG. 4. An identification circuit made of resistor 22 in series with an electroluminescent diode 24 is connected between the two terminals 10, 12 of the printed circuit 4. The identification circuit is in parallel with the conductive strip 6 of the printed circuit 4. Thus, normally, the current supplying the breaking detector passes through the conductive strip 6 of the printed circuit 4 and the electroluminescent diode 24 remains off. In the event of a breaking of the conductive strip 6 causing a circuit opening, the current then passes through the identification circuit and the electroluminescent diode 24 lights up.

A resin or any other insulating material will preferably be injected in the tube 2 in order to consolidate and stabilize the printed circuit 4 and the tube 2 together.

To facilitate the assembly of the pieces, the tube 2 may be provided with a cap 26 which may be glued to the upper end of the tube 2, the cap having an opening at the top for the passage of the cables 14 and 16 and the electroluminescent diode 24.

Figure 2:
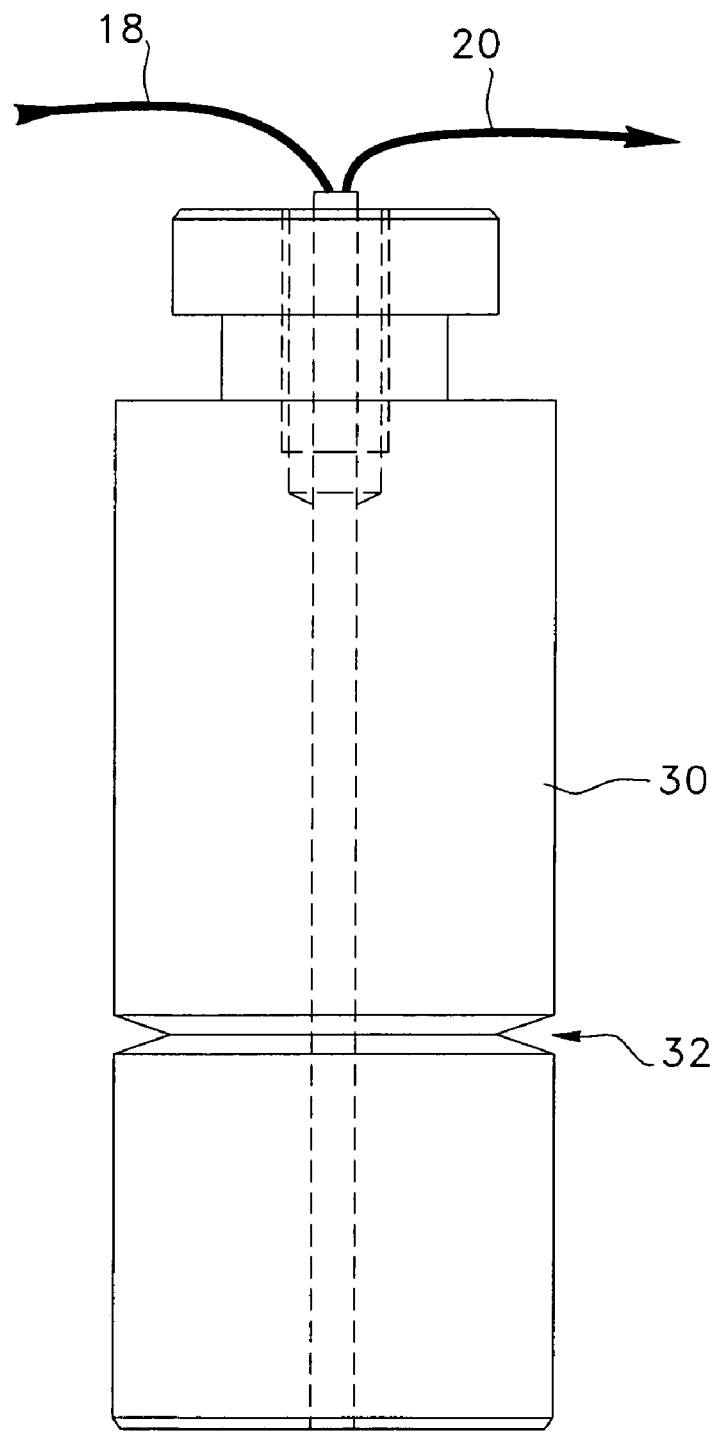
FIG. 2 is a schematic elevation view of a shear pin provided with a breaking detector.

Referring to FIG. 2, the breaking detector is insertable at the center of a shear pin 30. The shear pin 30 exhibits a weakness area 32 more prone to shearing efforts. The diameter at the bottom of the area 32 may be determined as a function of the respective breaking loads of the shear pin types and tests with samples in laboratory.

Referring to FIG. 4, all the breaking detectors 34 of a group are connected together and preferably to a warning pilot 36 of an alarm panel (not illustrated). When there is a breakage of a shear pin, such as represented by the circuit opening 38, the light indicator of the concerned detector and the warning pilot 36 of the alarm panel light up. The location of the defective shear pin is then easy and quick.

While embodiments of this invention have been illustrated in the accompanying drawings and described above, it will be evident to those skilled in the art that changes and modifications may be made therein without departing from the essence of this invention. For example, the printed circuit 4 can be replaced by a simple conductive wire (not illustrated) forming a loop along the length of the tube 2. In the case of a printed circuit, it will be possible to easily change its length by cutting it at the desired length and by soldering the sections then separated of the conductive strip together at the cut end of the printed circuit. The tube may also be cut at the desired length. The diameter of the tube, its thickness and its material composition may be chosen or adapted as a function of the dimensions of the shear pin and of the desired shear parameters. Any other appropriate type of warning pilot and of corresponding circuitry can be used instead of an electroluminescent diode. According to the use conditions of the breaking detector, the tube may be replaced by simple spaced apart rings (not illustrated). Adaptation rings may also be added to a tube if the outer diameter of the tube is too small for the bore or hole of a shear pin.

What is claimed is:

1. Breaking detector for a shear pin having a central bore, comprising:
   an electrically conductive element forming an elongated loop extending on a length of the bore of the shear pin and having upper ends defining contact surfaces adjacent each other;
   an electrically insulating element extending in the loop;
   power supply cables connected respectively to the contact surfaces and provided with connectors; and
   an electrically insulating means for removably supporting the elements of the detector in the bore of the shear pin; and
   an identification circuit including a light indicator connected between the contact surfaces, the light indicator projecting at an upper end of the means for supporting.

2. The detector according to claim 1, wherein the identification circuit comprises a resistor in series with an electroluminescent diode.

3. The detector according to claim 2, wherein the means for supporting comprises a tube insertable in the bore of the shear pin, and a cap mountable at an upper end of the tube, the elements of the detector extending in the tube, and the cap having a top opening for passage of the power supply cables.

4. The detector according to claim 3, wherein the electroluminescent diode projects on top of the cap.

5. The detector according to claim 4, wherein the tube is made of plastic material.

6. The detector according to claim 4, wherein the conductive element and the insulating element are formed by a printed circuit disposed in the tube, the printed circuit having a conductive strip on each side of a central insulating strip in order to form the elongated loop.

7. The detector according to claim 6, comprising an insulating material injected in the tube, consolidating the printed circuit and the tube together.

8. The detector according to claim 7, wherein the connectors of the power supply cables comprise respectively complementary male and female connectors.

9. The detector according to claim 6, wherein the conductive strip has upper ends forming connection terminals on each side of the insulating strip, the connection terminals providing the contact surfaces at the ends of the conductive element.

10. The detector according to claim 1, wherein the means for supporting comprises a tube insertable in the bore of the shear pin, the elements of the detector extending in the tube.

11. The detector according to claim 10, wherein the tube is made of plastic material.

12. The detector according to claim 10, comprising an insulating material injected in the tube.

13. The detector according to claim 1, wherein the conductive element and the insulating element are formed by a printed circuit having a conductive strip on each side of a central insulating strip in order to form the elongated loop.

14. The detector according to claim 13, wherein the conductive strip is made of copper.

15. The detector according to claim 13, wherein the conductive strip has upper ends forming connection terminals on each side of the insulating strip, the connection terminals providing the contact surfaces at the ends of the conductive element.

16. The detector according to claim 1, wherein the connectors of the power supply cables comprise respectively complementary male and female connectors.

17. A system for detecting breaking of shear pins that include respective central bores, comprising:
   a number of detectors, wherein the detectors include:
      an electrically conductive element forming an elongated loop extending on a length of the bore of the shear pin and having upper ends defining contact surfaces adjacent each other;
      an electrically insulating element extending in the loop;
      power supply cables connected respectively to the contact surfaces and provided with connectors; and
      an electrically insulating means for removably supporting the elements of the detector in the bore of the shear pin, and
      an identification circuit including a light indicator connected between the contact surfaces, the light indicator projecting at an upper end of the means for supporting, wherein the detectors are connected in series with one another by their connectors, the detectors being respectively inserted in the bores of the shear pins;
   a power supply source connected in series with the detectors; and
   a warning element connected between the source and the detectors, responsive to a breakage of the conductive element of one of the detectors caused by a breaking of a corresponding one of the shear pins.

18. Breaking detector for a shear pin having a central bore, comprising:

an electrically conductive element forming an elongated loop extending on a length of the bore of the shear pin and having upper ends defining contact surfaces adjacent each other;

an electrically insulating element extending in the loop;

power supply cables connected respectively to the contact surfaces and provided with connectors; and an electrically insulating means for removably supporting the elements of the detector in the bore of the shear pin, wherein the means for supporting comprises a tube insertable in the bore of the shear pin, the elements of the detector extending in the tube, wherein an insulating material is injected in the tube.

* * * * *